United States Patent [19]

Kokado

[11] Patent Number: 4,928,025
[45] Date of Patent: May 22, 1990

[54] EMITTER COUPLED LOGIC CIRCUIT

[75] Inventor: Masayuki Kokado, Machida, Japan

[73] Assignee: Fujitsu Limited, Kanagawa, Japan

[21] Appl. No.: 214,356

[22] Filed: Jul. 1, 1988

[30] Foreign Application Priority Data

Jul. 21, 1987 [JP] Japan ................................ 62-181965

[51] Int. Cl.[5] .............. H03K 19/086; H03K 19/003;
H03K 17/04; H03K 19/013
[52] U.S. Cl. .................................. 307/455; 307/299.3;
307/355; 307/544; 307/443
[58] Field of Search .............. 307/455, 270, 443, 454,
307/475, 355, 358, 367, 363, 299.2, 299.3, 3,
542, 544

[56] References Cited

U.S. PATENT DOCUMENTS

| | | | |
|---|---|---|---|
| 4,276,485 | 6/1981 | Rydval | 307/455 |
| 4,539,493 | 9/1985 | Varadarajan | 307/455 |
| 4,551,638 | 11/1985 | Varadarajan | 307/455 |
| 4,559,458 | 12/1985 | Ma | 307/455 |
| 4,631,427 | 12/1986 | Mazumder et al. | 307/455 |
| 4,675,554 | 6/1987 | Koury, Jr. et al. | 307/455 |
| 4,754,171 | 6/1988 | Dasai et al. | 307/455 |
| 4,810,900 | 3/1989 | Okabe | 307/455 X |

*Primary Examiner*—Stanley D. Miller
*Assistant Examiner*—David R. Bertelson
*Attorney, Agent, or Firm*—Armstrong, Nikaido, Marmelstein, Kubovcik & Murray

[57] ABSTRACT

An emitter coupled logic circuit includes variable impedance circuit which is connected to at least one of two output terminals of the ECL circuit for variably providing an impedance connected to the one output terminal. An impedance to be provided when both the levels of the two outputs are at a high-level is set to be smaller than an impedance to be provided when at least one of the two outputs is at a low-level.

11 Claims, 4 Drawing Sheets

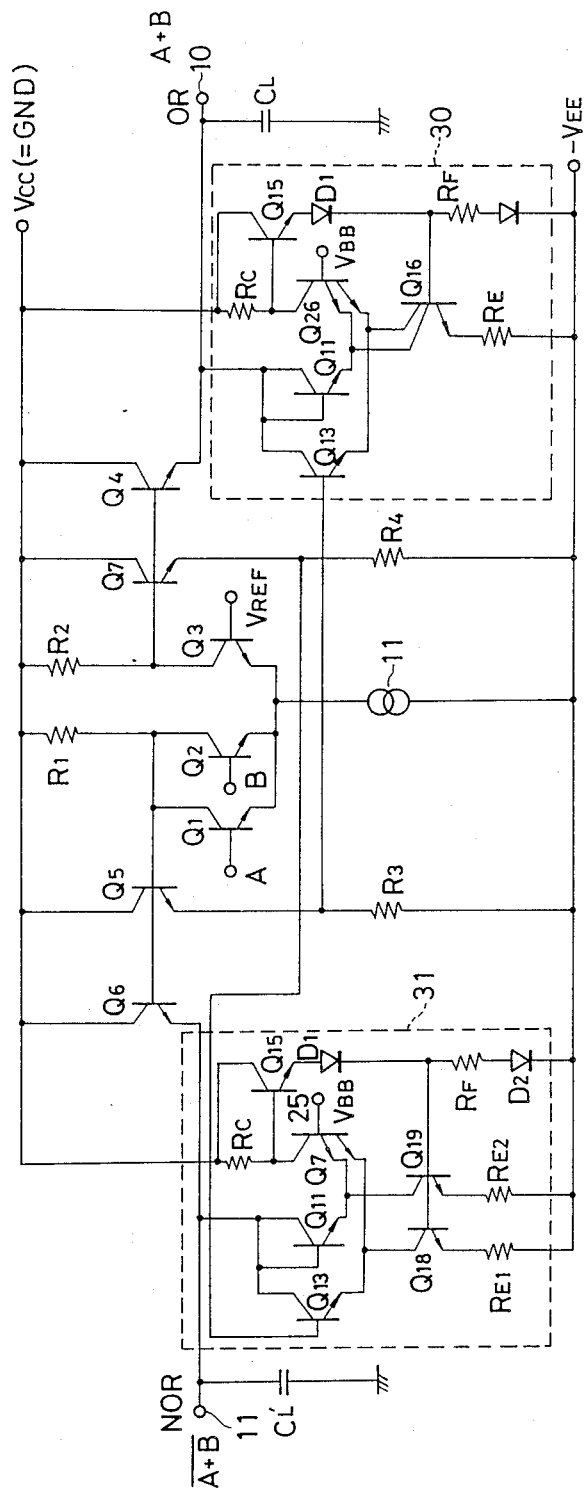
F I G. 6

EMITTER COUPLED LOGIC CIRCUIT

BACKGROUND OF THE INVENTION

The present invention generally relates to an emitter coupled logic circuit, and in particular to an emitter coupled logic circuit capable of driving a load capacitor having a large capacitance.

An emitter coupled logic circuit (hereafter simply referred to as an ECL circuit) is used in order to speed up the operation of a logic circuit. A transistor of the ECL circuit is not driven up to a saturated state, and is switched between an active state and a cut-off state. In the case where the ECL circuit drives a load capacitance having a large capacitance, the operation of the ECL circuit is delayed. Therefore, it is desirable to speed up the operation of the ECL circuit.

It is well known that a load capacitance coupled with an output terminal of the ECL circuit increases as the integration density of a semiconductor integrated circuit which implements the ECL circuit increases. This is because a wiring pattern formed on a semiconductor chip is apt to be lengthened as the integration density increases. When a potential of the output terminal of the ECL circuit is switched from a high-level (hereafter simply referred to as "H") to a low-level (hereafter simply referred to as "L"), a charge stored in the load capacitance is discharged by a load impedance which is coupled with the output terminal. Therefore as the load impedance is reduced, a time necessary for the potential at the output terminal to completely reach "L" can be reduced. Such a time is referred to as a fall time.

However, as the load impedance decreases, the power consumed in the ECL circuit increases. It is to be noted that the load impedance cannot be allowed to exceed a predetermined balue because there is a limit with respect to the total power consumption in the integrated circuit. For this reason, the time necessary for the potential at the output terminal of the ECL circuit to be switched to "L" (the fall time) cannot be effectively shortened.

Another ECL circuit has been proposed in the U.S. Pat. No. 4,539,493. This proposed ECL circuit employs an emitter follower circuit and utilizes a fact that when the output of the ECL circuit is switched from "H" to "L", a reverse logic output is switched from "L" to "H". The level change of the reverse logic output is supplied to a base of the emitter follower transistor through a capacitive coupling. Thereby the base level of the emitter follower transistor is increased, so that the change from "H" to "L" can be made faster. However, the operating speed of the proposed ECL circuit still depends on the magnitude of the load capacitance. A similar ECL circuit is disclosed in the U.S. Pat. No. 4,276,485, and has a similar disadvantage.

SUMMARY OF THE INVENTION

Therefore, a general object of the present invention is to provide a novel and useful emitter coupled logic circuit in which the above disadvantages of the conventional ECL circuits have been eliminated.

A more specific object of the present invention is to provide an emitter coupled logic circuit in which the fall time can be reduced with minimum power increase in the ECL circuit.

The above objects of the present invention can be achieved by an emitter coupled logic circuit including the following elements. A plurality of transistors constituting current switches receives input signals and outputs mutually opposite first and second outputs. Emitters of the plurality of transistors are mutually connected. A first emitter follower circuit extracts the first output, and the extracted first output is outputted through a first output terminal. A second emitter follower circuit extracts the second output, the extracted second output is outputted through a second output terminal. A variable impedance circuit is connected to at least one of the first and second output terminals and variable provides an impedance to be coupled with said one output terminal. An impedance to be provided when both the levels of the extracted first and second outputs are at a high-level is made smaller than an impedance to be provided when at least one of the first and second outputs is at a low-level.

Other objects, features and advantages of the present invention will become apparent from the following detailed description when read in conjunction with the accompanying drawings.

BRIEF DESCRIPTION OF THE DRAWINGS

FIG. 6 is a circuit diagram of an application of the present invention; and

DETAILED DESCRIPTION

Figure 1:
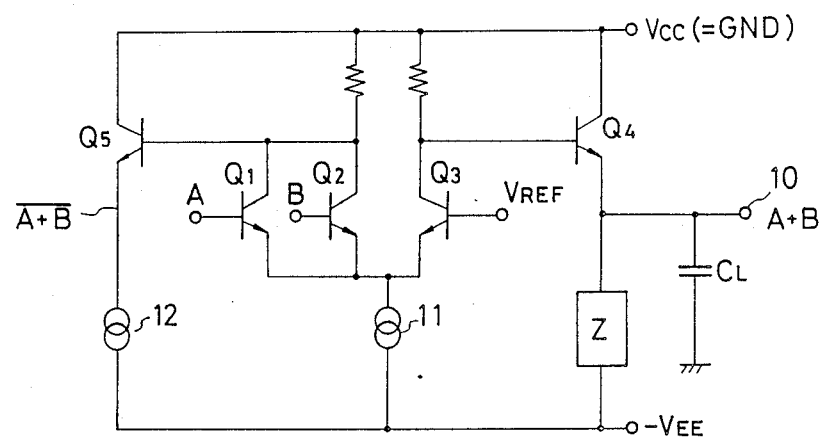
FIG. 1 is a circuit diagram of a conventional ECL circuit.

To facilitate the understanding of the present invention, a description is first given of a conventional ECL circuit with reference to FIG. 1.

Referring to FIG. 1, transistors Q1 and Q2 constitute a current switch together with a transistor Q3. Emitters of the transistors Q1, Q2 and Q3 are mutually connected, and also to a constant current source 11. Inputs A and B are supplied to bases of the transistors Q1 and Q2, respectively, and a reference potential $V_{REF}$ is applied to a base. An emitter follower transistor Q4 is connected to a collector of the transistor Q3. An emitter of the transistor Q4 is connected to an output terminal of the ECL circuit. An output A+B which is a result of an OR operation is obtained at the output terminal 10. A reverse logic output $\overline{A+B}$ is obtained at an emitter of a transistor Q5, which is connected to a constant current source 12. A reference label $V_{CC}$ denotes a positive power source voltage (a ground level in the illustrated example), and a reference $V_{EE}$ denotes a negative power source voltage.

As described before, a capacitance of a load capacitor $C_L$ coupled between the output terminal 10 and the ground increases as the integration density of an integrated circuit which implements the illustrated ECL circuit increases. This is because a wiring pattern in the ECL circuit is lengthened. When the potential at the output terminal 10 is switched from "H" to "L", a capacitance stored in the load capacitor $C_L$ is discharged through a load impedance Z. A fall time of the potential at the output terminal 10 can be decreased if the load impedance Z is reduced. However, as the load impedance Z decreases, the power consumed in the ECL circuit increases. It is to be noted that the load impedance Z cannot be allowed to lessen a predetermined value because there is a limit on the total consumed power in the integrated circuit. For this reason, the time necessary for the potential at the output terminal of the ECL circuit to be switched to "L" (the fall time) cannot be satisfactorily shortened.

The present invention is directed to overcoming the above disadvantage of the conventional ECL circuit.

Figure 2:
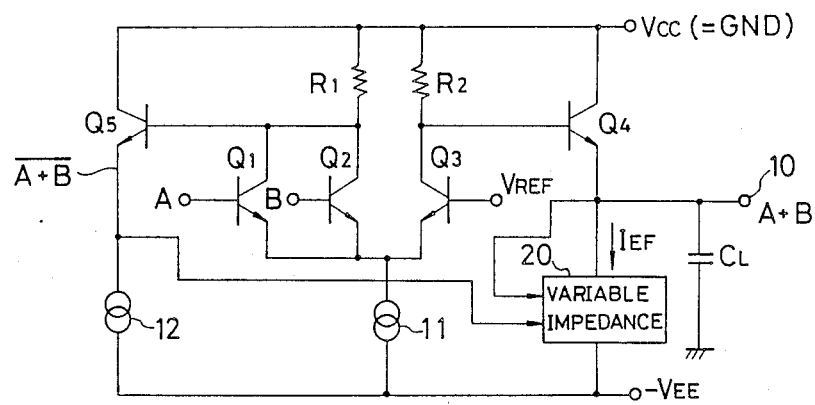
FIG. 2 is a circuit diagram for explaining the principle of the present invention.

FIG. 2 is a circuit diagram for explaining the principle of the present invention. In FIG. 2, the same elements as those in FIG. 1 are indicated by the same references. The emitters of the transistors Q1, Q2 and Q3 are mutually connected, and one current switch is constituted by the transistors Q1, Q2 and Q3. The output of the current switch is extracted by the emitter follower transistor Q4 and is then applied to the output terminal 10.

A variable impedance circuit 20 is connected between the output terminal 10 and the negative power source voltage $-V_{EE}$. The variable impedance circuit 20 can provide two different impedances, depending on a level of the output obtained at the output terminal 10 and the reverse logic output obtained at the emitter of the transistor Q5. An impedance which is provided by the variable impedance circuit 20 when both the outputs are set at "H", is made smaller than an impedance which is provided by the variable impedance circuit when either one of the output signals is at "L". Therefore, it becomes possible to rapidly discharge the charge stored in the load capacitor $C_L$ when the potential at the output terminal 10, or the output signal is switched from "H" to "L". In detail, when the potentials at the output terminal 10 and the emitter of the transistor Q5 are both at "H", that is, when the fall of the potential at the output terminal 10 is delayed due to the load capacitor $C_L$, the impedance provided by the variable impedance circuit 20 is decreased, so that the charge stored in the load capacitor $C_L$ can be rapidly discharged through the circuit 20. On the other hand, when either one of the potentials at the output terminal 10 and the emitter of the transistor Q5 is kept at "L" (this state is referred to as a stationary state), the impedance provided by the variable impedance circuit 20 is increased, so that the power consumed in the whole of the ECL circuit can be reduced.

Figure 3:
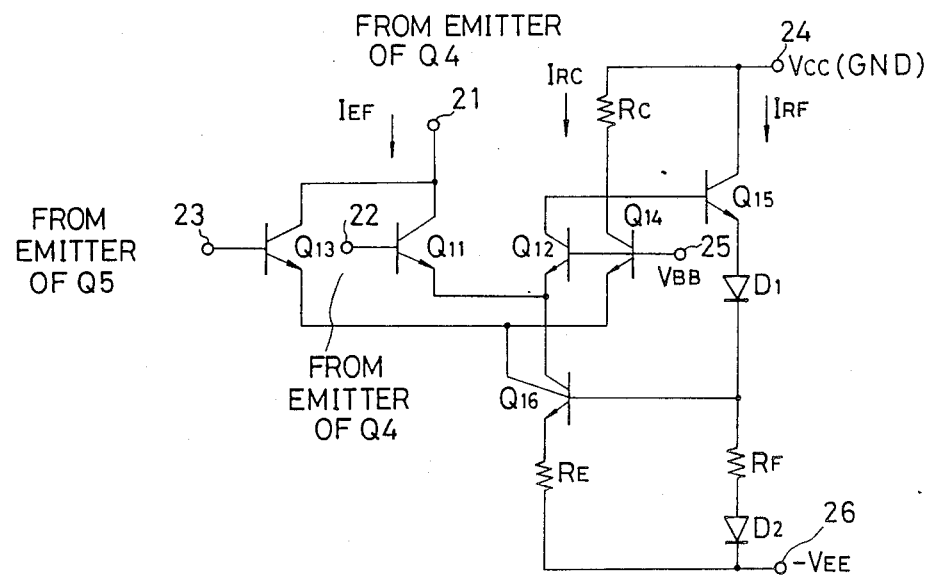
FIG. 3 is a circuit diagram of a preferred circuit structure of a variable impedance circuit shown in FIG. 2.

FIG. 3 shows a detailed configuration of one example of the variable impedance circuit provided by a preferred embodiment of the present invention. Referring to FIG. 3, transistors Q11, Q12 are paired by connecting emitters thereof to each other, and thereby constitutes a current switch. The transistors Q13 and Q14 are paired by connecting emitters thereof to each other, and thereby constitutes a current switch. Collectors of the transistors Q11 and Q13 are connected to the emitter of the transistor Q4 shown in FIG. 2 through a terminal 21. Terminals 22 and 23 are connected to the emitters of the transistors Q4 and Q5, respectively. Collectors of the transistors Q12 and Q14 are connected to a base of a transistor Q15 and also to a terminal 24 through a resistor $R_C$. The positive power source voltage $V_{CC}$ set at the ground level is applied to the terminal 24. Bases of the transistors Q12 and Q14 are connected to a terminal 25, to which a reference voltage $V_{BB}$ is applied. The reference voltage $V_{BB}$ is a constant voltage between "H" and "L" which are obtained at the output terminal. Emitters of the transistors Q11 and Q12 are connected to the first collector of a transistor Q16 which serves as a constant current source, and emitters of the transistors Q13 and Q14 are connected to the second collector of the transistor Q16.

A collector of the transistor Q15 is connected to the terminal 24, and an emitter of the transistor thereof is connected, through a level shift diode D1, a resistor $R_F$ and a diode D2, to a terminal 26. The negative power source voltage $-V_{EE}$ is applied to the terminal 26. A base of the transistor Q16 is connected to a cathode of the diode D1, and an emitter thereof is connected to the terminal 26 through a register $R_E$. The ON/OFF state of the transistor Q16 is controlled by the transistor Q15.

In operation, when the potential at the terminal 10 falls from "H" to "L", both the emitters of the transistor Q4 and Q5, i.e., the terminals 22 and 23 transitionally have potentials at "H" due to the discharge of the load capacitor $C_L$, until the potential at the terminal 10 reaches the reference voltage $V_{BB}$. Therefore, the transistors Q11 and Q13 are allowed to conduct, while the transistors Q12 and Q14 are cut off. At this time, the base potential of the transistor Q15 is at the ground level (GND), and the emitter of the transistor Q16 has a potential (GND$-3V_{BE}$), where $V_{BE}$ denotes a base-emitter voltage of each of the illustrated transistors. Therefore, a current $I_{EF}$ which passes through the resistors $R_E$ from the terminal 21 can be represented as $(V_{EE}-3V_{BE})/R_E$. It is now assumed that the negative power source voltage $-V_{EE}$ is equal to $-3.6$ [V]. With the resistor $R_E$ equal to 1.2 [kΩ], the current $I_{EF}$ is approximately 1 [mA]. A current $I_{RC}$ which passes through the resistor $R_C$ is zero. A current $I_{RF}$ which passes through the resistor $R_F$ can be described as $(V_{EE}-3V_{BE})/R_F$. In the case where the resistor $R_F$ is 10 [kΩ], the current $I_{RF}$ is approximately 0.12 [mA].

When either one of the terminals 22 and 23 has "H" and the other has "L" in the stationary state, for example when the terminal 23 has "H" and the terminal 22 has "L", the transistors Q12 and Q13 conduct, the currents $I_{EF}$ and $I_{RC}$ become identical to each other. In this case, the base potential of the transistor Q15 is (GND$-I_{RC}\cdot R_C$), and the emitter potential of the transistor Q16 is (GND$-I_{RC}\cdot R_C-3V_{BE}$). Both the currents $I_{EF}$ and $I_{RC}$ pass through the resistor $R_E$, and thus each of the currents $I_{EF}$ and $I_{RC}$ can be expressed as $(V_{EE}-3V_{BE})/(2R_E+R_C)$, and is approximately 0.12 [mA] where $R_C=7.6$ [kΩ]. The current $I_{RF}$ can be expressed as $(V_{EE}-3V_{BE})2R_E/[(2R_E+R_C)R_F]$, and is approximately 0.03 [mA].

When the potentials at both the terminals 22 and 23 are at "L", the current $I_{EF}$ is zero, and the current $I_{RC}$ can be represented as $(V_{EE}-3V_{BE})/(R_E+R_C)$. Assuming the above-described values, the current $I_{RC}$ is approximately 0.14 [mA]. And the current $I_{RF}$ can be represented as $(V_{EE}-3V_{BE})R_C/[R_F(R_E+R_C)]$, and is approximately 0.10 [mA].

In this manner, the variable impedance circuit 20 shown in FIG. 2 is changed to a low impedance during the transitional time period in which the potential of the output terminal 10 is switched from "H" to "L". Thereby the current $I_{EF}$ becomes approximately 1 [mA] as described before, so that the variable impedance circuit 20 enables the charge stored in the load capacitor $C_L$ to be rapidly discharged. On the other hand, in the stationary state, the variable impedance circuit 20 is changed to a high-impedance state and permits the current $I_{EF}$ having a value of only 0.12 [mA] to pass therethrough. Further, a current flow through the whole of the circuit of FIG. 3 is 1.12 [mA] during the transitional period, while current flow therethrough is only 0.24 [mA] in the stationary state. Further, the magnitude of the current $I_{EF}$ is determined depending on the resistor $R_E$ during the transitional time period and is determined depending on the resistors $R_E$ and $R_C$ in the stationary state. Therefore, it becomes possible to obtain an optimum value of the current $I_{EF}$ such that the current $I_{EF}$ is relatively large during the transitional period, and is relatively small in the stationary state, by setting the resistor $R_E$ to a small value and setting the resistor $R_C$ to a large value.

Figure 4:
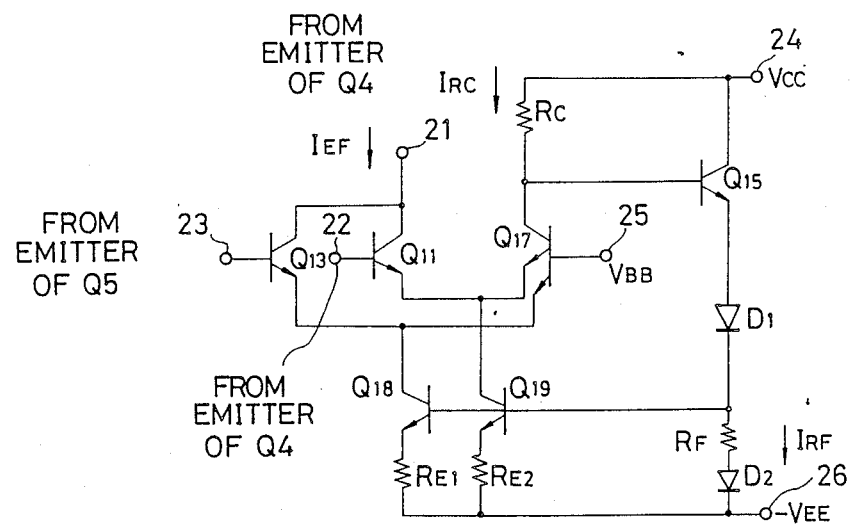
FIG. 4 is a circuit diagram of a variation of the variable impedance circuit.

FIG. 4 shows a variation of the variable impedance circuit 20. The illustrated variation is different from the circuit structure of FIG. 3 in the following matters. First, a multiemitter transistor Q17 is used in place of the transistors Q12 and Q14. A first emitter of the transistor Q17 is connected to the emitter of the transistor Q11, and a second emitter thereof is connected to the emitter of the transistor Q13. Secondly, transistors Q18 and Q19 are used in place of the transistors Q16. A collector of the transistor Q18 is connected to the emitter of the transistor Q13 and the second emitter terminal of the transistor Q17. A collector of the transistor Q19 is connected to the emitter of the transistor Q11 and the first emitter of the transistor Q17. An emitter of the transistor Q18 is connected to the negative power source voltage $-V_{EE}$ through a resistor $R_{E1}$, and an emitter of the transistor Q19 is connected to the negative power source voltage $-V_{EE}$ through a resistor $R_{E2}$.

In operation, when both the terminals 22 and 23 are at "H", the current $I_{EF}$ is represented as $(V_{EE}-3V_{BE})/R_E$ where $R_{E1}=R_{E2}=2R_E$, and is approximately 1 [mA]. The current $I_{RC}$ is zero, and the current $I_{RF}$ is represented as $(V_{EE}-3V_{BE})/R_F$. With the resistor $R_F$ equal to 12 [kΩ], the current $I_{RF}$ is approximately 0.1 [mA].

When either one of the terminals 22 and 23 is at "H", each of the currents $I_{EF}$ and $I_{RC}$ is represented as $(V_{EE}-3V_{BE})/(2R_E+R_C)$, and is approximately 0.12 [mA]. Further when both the terminals 22 and 23 are at "L", the current $I_{EF}$ is zero, and the current $I_{RC}$ is expressed as $(V_{EE}-3V_{BE})/(R_E+R_C)$ and is approximately 0.14 [mA]. The current $I_{RF}$ is expressed as $[R_E(V_{EE}-3V_{BE})/R_F]/[(R_E+R_C)]$, and is approximately 0.014 [mA].

Figure 5:
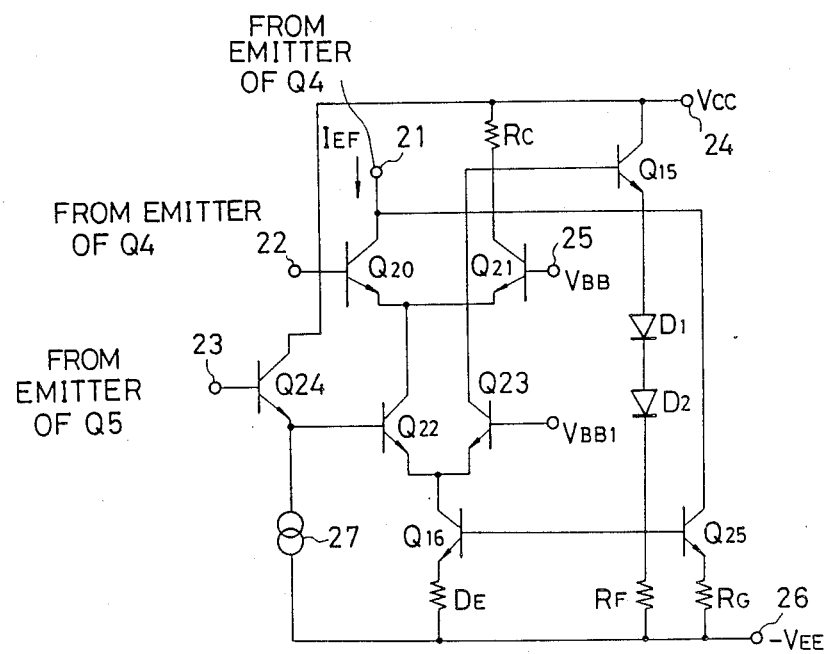
FIG. 5 is a circuit diagram of another variation of the variable impedance circuit.

FIG. 5 shows another variation of the variable impedance circuit 20 shown in FIG. 2. Emitters of transistors Q20 and Q21 are connected to each other, and thereby the transistors Q20 and Q21 constitute a current switch. Bases of the transistors Q20 and Q21 are connected to the terminals 22 and 25, respectively. A collector of the transistor Q20 is connected to the terminal 21, and a collector of the transistor Q21 is connected to the positive power supply $V_{CC}$ through the resistor $R_C$. Emitters of transistor Q22 and Q23 are connected to each other, and thereby the transistors Q22 and Q23 constitute a current switch. A collector of the transistor Q22 is connected to the emitters of the transistors Q20 and Q21, and a collector of the transistor Q23 is connected to the positive power source $V_{CC}$ through the resistor $R_C$. A base of the transistor Q22 is connected to an emitter of a transistor Q24 which is an emitter follower. A base of the transistor Q23 is supplied to a reference voltage $V_{BB1}$, which may be set equal to a voltage of $(V_{BB}-V_{BE})$. The transistor Q24 is used for decreasing a potential level in order to apply a suitable bias voltage to the transistor Q22. A collector of the transistor Q24 is connected to the positive power source $V_{CC}$, and a base thereof is connected to the terminal 23. An emitter of the transistor Q24 is connected to a constant current source 27. The emitters of the transistors Q22 and Q23 are connected to the collector of the transistor Q16 which serves as the constant current source. The collector of the transistor Q20 is connected to a collector of a transistor Q25. The transistor Q25 is provided in order to prevent the output terminal 10 of the ECL circuit from being set in the floating state in which the current $I_{EF}$ becomes zero when either the terminals 22 or 23 are at "L". The emitter terminal of the transistor Q15 is connected to the base of the transistor Q25 through diodes D1 and D2 used for the level adjustment. The base of the transistor Q25 is also connected to the base of the transistor Q16 and also to the negative power source $-V_{EE}$ through a resistor $R_F$. An emitter of the transistor Q25 is connected to the negative power source $-V_{EE}$ through a resistor $R_G$.

In operation, when both the terminals 22 and 23 are at "H", a current passes through the transistors Q20, Q22 and Q16 in this sequence, and is represented as $(V_{EE}-4V_{BE})/R_E$. At this time, a current which passes through the transistor Q25 is expressed as $(V_{EE}-4V_{BE})/R_G$. Therefore, the current $I_{EF}$ is an addition of the current flow through the transistor Q16 and the current flow through the transistor Q25, and is represented as $(V_{EE}-4V_{BE})(1/R_E+u/R_G)$. When one of the terminals 22 and 23 or both of them are at "L", the transistor Q20 is maintained in the OFF state, and therefore the current is allowed to flow through a path composed of the resistor $R_C$ and the transistors Q21, Q22 and Q16, or a path composed of the resistor $R_C$ and the transistors Q23 and Q16. At this time, the current which passes through the transistor Q16 is expressed as $(V_{EE}-4V_{BE})/(R_E+R_C)$. The current which passes through the transistor Q25 is $R_E/R_G$ times greater than the current flow through the transistor Q16, that is, $(V_{EE}-4V_{BE})[1/(R_E+R_C)](R_E/R_G)$. Because the transistor Q20 is kept in the OFF state, the current $I_{EF}$ is equal to the current which passes through the transistor Q25. With respect to the current $I_{EF}$, when comparing the case where the terminals 22 and 23 are both at "H" with the other cases, $(V_{EE}-4V_{BE})(1/R_E+1/R_G)$ is always larger than $(V_{EE}-4V_{BE})[1/(R_E+R_C)](R_E/R_G)$ for any positive resistance value of the resistor $R_C$. As a result, in the transitional state where both the terminals 22 and 23 are at "H", the current $I_{EF}$ having a value larger than values for the other states.

FIG. 6 shows an application of the ECL circuit of the present invention. The base inputs A and B of the transistors Q1 and Q2 are compared with the reference voltage $V_{REF}$ which is applied to the base of the transistor Q3. The OR operation result $\overline{A+B}$ is obtained at the output terminal 10, and the NOR operation result A+B is obtained at another output terminal 11 of the ECL circuit. To perform the NOR operation, transistors Q6 and Q7 of emitter followers are provided. A variable impedance circuit 30 is provided on the side of the OR operation, and a variable impedance circuit 31 is provided on the side of the NOR operation. The variable impedance circuit 30 is constituted by substituting the transistors Q12 and Q14 shown in FIG. 3 with a transistor Q26 having two emitters such as the transistors Q17 shown in FIG. 4. On the other hand, the variable impedance circuit 31 is the same as that shown in FIG. 4. An emitter of the transistor Q7 is connected to the base of the transistor Q13 of the variable impedance circuit 31, and an emitter of the transistor Q6 is connected to the collectors of the transistors Q11 and Q13 and also to the emitter of the transistor Q11. The emitters of the transistors Q5 and Q7 are connected to the negative power source $-V_{EE}$ through resistors $R_3$ and $R_4$, respectively.

Figure 7:
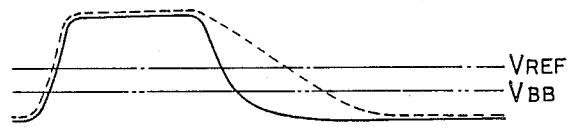
FIGS. 7(A) and 7(B) are views showing waveforms at portions of the circuit shown in FIG. 6.
Figure 7:
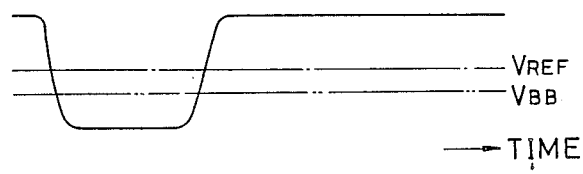

In operation, when the level of the transistor Q5 is switched as shown in FIG. 7(B), if the variable impedance circuit 30 is not provided in the ECL circuit, the potential at the output terminal 10 varies as shown by a broken line shown in FIG. 7(A), and the fall time of the potential at the output terminal 10 would be lengthened. On the other hand, in the illustrated circuit having the variable impedance circuit 30, the potential at the output terminal 10 varies as shown by a solid line shown in FIG. 7(A), so that the fall time can be greatly decreased.

The present invention is not limited to the embodiments described above, and variations and modifications may be made without departing from the scope of the present invention. For example, in place of the transistor Q16, the pair of the transistors Q18 and Q19 shown in FIG. 4 may be used. Further, the present invention includes an emitter coupled logic circuit having three or more inputs.

What is claimed is:

1. An emitter coupled logic circuit, comprising:
a plurality of transistors constituting current switches for receiving input signals and outputting mutually opposite first and second outputs, emitters of the plurality of transistors being mutually connected;
first emitter follower means for drawing the first output from said current switches, the first output being outputted through a first output terminal;
second emitter follower means for drawing the second output from said current switches, the second output being outputted through a second output terminal; and
variable impedance means being connected to both the first and second output terminals for providing a variable impedance to be coupled with said one output terminal, wherein said variable impedance means is for providing a first impedance when levels of the drawn first and second outputs are both at a high-level, and a second impedance when at least one of the first and second outputs is at a low-level, and wherein said first impedance is less than said second impedance.

2. An emitter coupled logic circuit, comprising:
a plurality of transistors constituting current switches for receiving input signals and outputting mutually opposite first and second outputs, emitters of the plurality of transistors being mutually connected;
first emitter follower means for drawing the first output from said current switches, the first output being outputted through a first output terminal;
second emitter follower means for drawing the second output from said current switches, the second output being outputted through a second output terminal; and
variable impedance means being connected to at least one of the first and second output terminals for providing a variable impedance to be coupled with said one output terminal, wherein said variable impedance means is for providing a first impedance when levels of the drawn first and second outputs are both at a high-level, and a second impedance when at least one of the first and second outputs is at a low-level,
wherein said first impedance is less than said second impedance, and
wherein said variable impedance means comprises a first pair of transistors, emitters of which are connected to each other; a second pair of transistors, emitters of which are connected to each other, a collector of one of the first paired transistors and a collector of one of the second paired transistors being connected to each other, a collector of the other of the first paired transistors and a collector of the other of the second paired transistors being connected to each other and also to a positive power source through a resistor, a base of said one of the first paired transistors being connected to the first output terminal of the first emitter follower means, a base of said one of the second paired transistors being connected to the second output of the second emitter follower means, bases of said the others of the first and second paired transistors being supplied with a reference voltage; constant current source means being connected between the emitters of each of the first and second paired transistors and a negative power source; and third emitter follower means being connected to the collectors of said the other of the first and second paired transistors for controlling ON/OFF states of the constant current means.

3. An emitter coupled logic circuit as claimed in claim 2, wherein said the other transistors of the first and second paired transistors are constituted by one transistor having two emitters.

4. An emitter coupled logic circuit as claimed in claim 2, wherein said constant current source means comprises two transistors, one of which is connected to the emitter of the first paired transistors, and the other of which is connected to the emitters of the second paired transistors, and wherein bases of said two transistors are connected to the negative power source through a third register and a diode, and are also connected to the third emitter follower means, and emitters of said two transistors are connected to the negative power source through respective emitter resistors.

5. An emitter coupled logic circuit as claimed in claim 2, wherein said constant current source comprises one transistor having two collectors, one of which is connected to the emitters of the first paired transistors, and the other of which is connected to the emitters of the second paired transistors, and wherein a base of said one transistor of the constant current source is connected to the negative power source through a third resistor and a diode and also to the third emitter follower means, and an emitter of said one transistor having the two collectors is connected to the negative power source through an emitter resistor.

6. An emitter coupled logic circuit as claimed in claim 2, wherein the third emitter follower means comprises a transistor, a base of which is connected to the collectors of said the others of the first and second paired transistors, an emitter of which is connected to the constant current source through a level shift diode, and a collector of which is connected to the positive power source.

7. An emitter coupled logic circuit, comprising:

a plurality of transistors constituting current switches for receiving input signals and outputting mutually opposite first and second outputs, emitters of the plurality of transistors being mutually connected;

first emitter follower means for drawing the first output from said current switches, the first output being outputted through a first output terminal;

second emitter follower means for drawing the second output from said current switches, the second output being outputted through a second output terminal; and variable impedance means being connected to at least one of the first and second output terminals for providing a variable impedance to be coupled with said one output terminal, wherein said variable impedance means is for providing a first impedance when levels of the drawn first and second outputs are both at a high-level, and a second impedance when at least one of the first and second outputs is at a low-level, wherein said first impedance is less than said second impedance, and wherein said variable impedance means comprises a first pair of transistors, emitters of which are connected to each other, a collector and base of one of the first paired transistors being connected to the first output of the first emitter follower means, a base of the other of the first paired transistors being supplied with a reference voltage; a second pair of transistors, emitters of which are connected to each other, a collector of one of the second paired transistors being connected to the emitters of the first pair of the transistors, a collector of the other of the second paired transistors being connected to a collector of the other of the first paired transistors, a base of the other of the second paired transistors being supplied with another reference voltage; a level adjusting transistor for adjusting a bias level to be applied to a base of said one of the first paired transistors, the level adjusting transistor being controlled by the second emitter follower means; constant current source means being connected to the mutually connected emitters of the second pair of transistors; a driving transistor for controlling ON/OFF states of the constant current source means; and a controlling means for forming a current path between the first output terminal and the negative power source.

8. An emitter coupled logic circuit as claimed in claim 7, wherein the constant current source comprises a transistor, a collector of which is connected to the emitters of the second pair of the transistors, an emitter of which is connected to the negative power source through a resistor, a base of which is connected to a base of the controlling transistor, and wherein a collector of the controlling transistor is connected to the collector of said one of the first pair of transistors, an emitter of the controlling transistor is connected to the negative power source through an emitter resistor, the base of which is connected to the negative power source through a base resistor.

9. An emitter coupled logic circuit as claimed in claim 7, wherein the level adjusting transistor is an emitter follower, and wherein an emitter of the emitter follower transistor is connected to the base terminal of said one of the second paired transistors, a collector of which is connected to the positive power source, and a base of which is connected to the output of the second emitter follower means.

10. An emitter coupled logic circuit as claimed in claim 7, wherein the third emitter follower means comprises a transistor, a base of which is connected to said one of the first paired transistors, a collector of which is connected to the positive power source, and a base of which is connected to the constant current source means through a level shift diode and also to a base of the controlling transistor.

11. An emitter coupled logic circuit, comprising:

a plurality of transistors constituting current switches for receiving input signals and outputting mutually opposite first and second outputs, emitters of the plurality of transistors being mutually connected;

first emitter follower means for drawing the first output from said current switches, the first output being outputted through a first output terminal;

second emitter follower means for drawing the second output from said current switches, the second output being outputted through a second output terminal; and variable impedance means being connected to at least one of the first and second output terminals for providing a variable impedance to be coupled with said one output terminal, wherein said variable impedance means is for providing a first impedance when levels of the drawn first and second outputs are both at a high-level, and a second impedance when at least one of the first and second outputs is at a low-level, wherein said first impedance is less than said second impedance, and wherein said variable impedance means is provided at each of the first and second output terminals.

* * * * *